United States Patent
Lin et al.

(10) Patent No.: US 9,007,829 B2
(45) Date of Patent: Apr. 14, 2015

(54) MEMORY REPAIRING METHOD, AND MEMORY CONTROLLER AND MEMORY STORAGE APPARATUS USING THE SAME

(71) Applicant: Phison Electronics Corp., Miaoli (TW)

(72) Inventors: Wei Lin, Taipei (TW); Yu-Cheng Hsu, Yilan County (TW); Kuo-Yi Cheng, Taipei (TW); Chun-Yen Chang, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 143 days.

(21) Appl. No.: 13/778,055

(22) Filed: Feb. 26, 2013

(65) Prior Publication Data

US 2014/0160844 A1    Jun. 12, 2014

Related U.S. Application Data

(60) Provisional application No. 61/734,375, filed on Dec. 7, 2012.

(30) Foreign Application Priority Data

Jan. 17, 2013 (TW) .............................. 102101817 A

(51) Int. Cl.
    G11C 29/04     (2006.01)
    G11C 29/00     (2006.01)
    G11C 16/14     (2006.01)
    G11C 16/34     (2006.01)

(52) U.S. Cl.
    CPC ................ *G11C 29/82* (2013.01); *G11C 16/14* (2013.01); *G11C 29/04* (2013.01); *G11C 16/349* (2013.01); *G11C 2029/0409* (2013.01)

(58) Field of Classification Search
    CPC ........ G11C 16/22; G11C 16/04; G11C 16/14; G11C 8/08; G11C 16/3454; G11C 16/349
    USPC ............. 365/185.04, 185.09, 185.22, 185.23, 365/185.24, 201
    See application file for complete search history.

(56) References Cited

U.S. PATENT DOCUMENTS

| 7,350,046 B2* | 3/2008 | Sicola et al. .................. 711/170 |
| 8,694,719 B2* | 4/2014 | Lassa et al. ................... 711/103 |
| 2013/0205076 A1* | 8/2013 | Schuette et al. ............. 711/103 |
| 2014/0115425 A1* | 4/2014 | Camalig et al. .............. 714/769 |

* cited by examiner

*Primary Examiner* — Gene Auduong
(74) *Attorney, Agent, or Firm* — Jianq Chyun IP Office

(57) ABSTRACT

A memory repairing method for a rewritable non-volatile memory module and a memory controller and a memory storage apparatus are provided. The method includes monitoring a wear degree of the rewritable non-volatile memory module; determining whether the wear degree of the rewritable non-volatile memory module is larger than a threshold; and heating the rewritable non-volatile memory module such that the temperature of the rewritable non-volatile memory module lies in between 100° C.~600° C. if the wear degree of the rewritable non-volatile memory module is larger than the threshold. Accordingly, deteriorated memory cells in the rewritable non-volatile memory module can be repaired, thereby preventing data loss.

24 Claims, 9 Drawing Sheets

MEMORY REPAIRING METHOD, AND MEMORY CONTROLLER AND MEMORY STORAGE APPARATUS USING THE SAME

CROSS-REFERENCE TO RELATED APPLICATION

This application claims the priority benefits of U.S. provisional application Ser. No. 61/734,375, filed on Dec. 7, 2012 and Taiwan application serial no. 102101817, filed on Jan. 17, 2013. The entirety of each of the above-mentioned patent applications is hereby incorporated by reference herein and made a part of this specification.

BACKGROUND

1. Technology Field

The present invention relates to a memory repairing method, and a memory controller and a memory storage apparatus using the memory repairing method.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

Referring to FIG. 1, a flash memory device 1 includes a charge-trapping layer 2 for storing electrons, a control gate 3 for applying a bias voltage, a tunnel oxide layer 4 and an interpoly dielectric layer 5. When data is about to be written to the flash memory device 1, a threshold voltage of the flash memory device 1 may be changed by injecting electrons into the charge-trapping layer 2. Accordingly, a digital level state of the flash memory device 1 is defined to implement a function of storing data. Here, the process of injecting the electrons to the charge-trapping layer 2 is referred to as programming. Otherwise, when the data is about to be removed, the flash memory device 1 is restored to the unprogrammed state by removing the injected electrons from the charge-trapping layer 2.

During operations of writing and erasing, the flash memory device 1 would be worn due to frequently injecting and removing the electrons, which leads to the increased speed of writing the electrons and wider distribution of the threshold voltage. As a result, after being programmed, the storage state of the flash memory device 1 can't be accurately identified, which results in the occurrence of error bits.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a memory repairing method, a memory controller, and a memory storage apparatus, which can repair deteriorated memory cells and restore a storage capacity of a memory module.

An exemplary embodiment of the present invention provides a memory repairing method for a rewritable non-volatile memory module. The memory repairing method include monitoring a wear degree of at least a portion of the rewritable non-volatile memory module; and heating the at least a portion of the rewritable non-volatile memory module when the wear degree of at least a portion of the rewritable non-volatile memory module is larger than a threshold.

Another exemplary embodiment of the present invention provides a memory controller for controlling a rewritable non-volatile memory module. The memory controller includes a host interface, a memory interface, a buffer memory and a memory management circuit. The host interface is configured to couple a host system, the memory interface is configured to couple to the rewritable non-volatile memory module, and the memory management circuit is coupled to the host interface, the memory interface and the buffer memory. The memory management circuit is configured to monitor a wear degree of at least a portion of the rewritable non-volatile memory module. And, when the wear degree of at least a portion of the rewritable non-volatile memory module is larger than a threshold, the memory management circuit instructs to heat the at least a portion of the rewritable non-volatile memory module.

Yet another exemplary embodiment of the present invention provides a memory storage apparatus which includes a connector, a rewritable non-volatile memory module, and a memory controller. The connector is configured to couple to a host system. The memory controller includes a buffer memory and is coupled to the connector and the rewritable non-volatile memory module. The memory controller is configured to monitor a wear degree of at least a portion of the rewritable non-volatile memory module. And, when the wear degree of at least a portion of the rewritable non-volatile memory module is larger than a threshold, the memory controller instructs to heat the at least a portion of the rewritable non-volatile memory module.

Based on the above, the memory repairing method, the memory controller, and the memory storage apparatus in the exemplary embodiments of the present invention can timely repair deteriorated rewritable non-volatile memory module to restore data storage capacity of memory cells, thereby reliably storing data.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
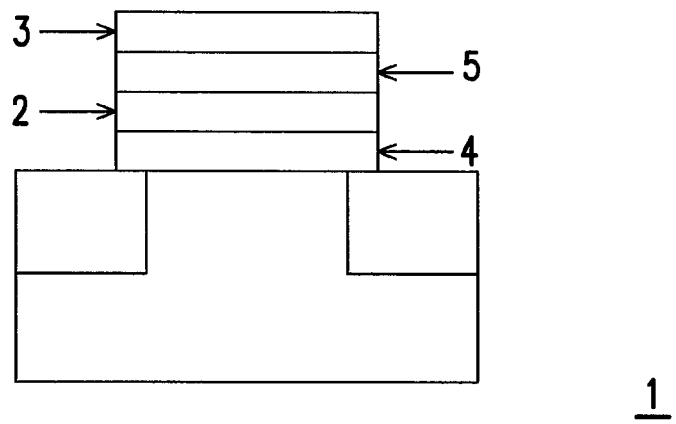
FIG. 1 is a schematic diagram illustrating a flash memory element according to the related art.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
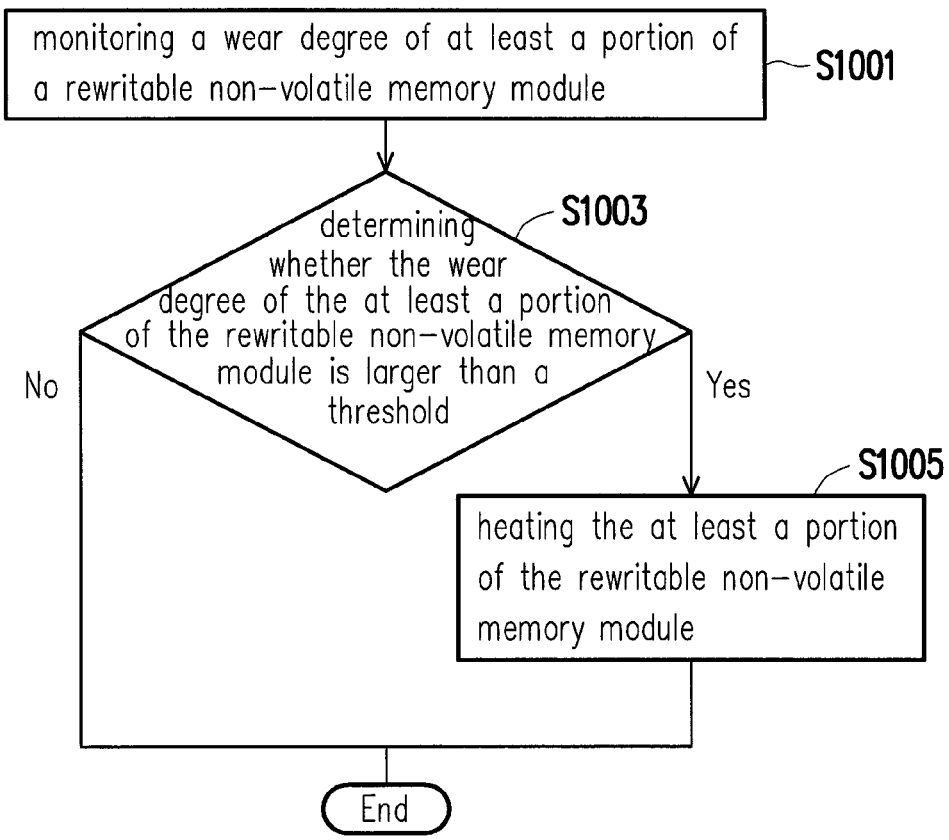
FIG. 2 is a flowchart illustrating a memory repairing method according to an exemplary embodiment of the present invention.

During operations of writing and erasing, a partial structure (for example, a tunnel oxide layer) of a rewritable non-volatile memory module may be worn due to frequently injecting and removing electrons, which leads to the increased speed of writing the electrons and wider distribution of a threshold voltage. In order to restore the storage reliability of the rewritable non-volatile memory module, as shown in FIG. 2, in an exemplary embodiment, a wear degree of at least a portion of a rewritable non-volatile memory module is monitored (step S1001); whether the wear degree of the at least a portion of the rewritable non-volatile memory module is larger than a threshold is determined (S1003); and the at least a portion of the rewritable non-volatile memory module is heated such that the temperature of the at least a portion of the rewritable non-volatile memory module lies in between 100° C.~600° C. if the wear degree of the at least a portion of the rewritable non-volatile memory module is larger than the threshold (S1005). In order to make the aforementioned and other features and advantages of the present invention more comprehensible, several embodiments accompanied with figures are described in detail below.

First Exemplary Embodiment

A memory storage apparatus (i.e., a memory storage system) typically includes a rewritable non-volatile memory module and a controller (i.e., a control circuit). The memory storage apparatus is usually used together with a host system, such that the host system can write data into or read data from the memory storage apparatus.

Figure 3:
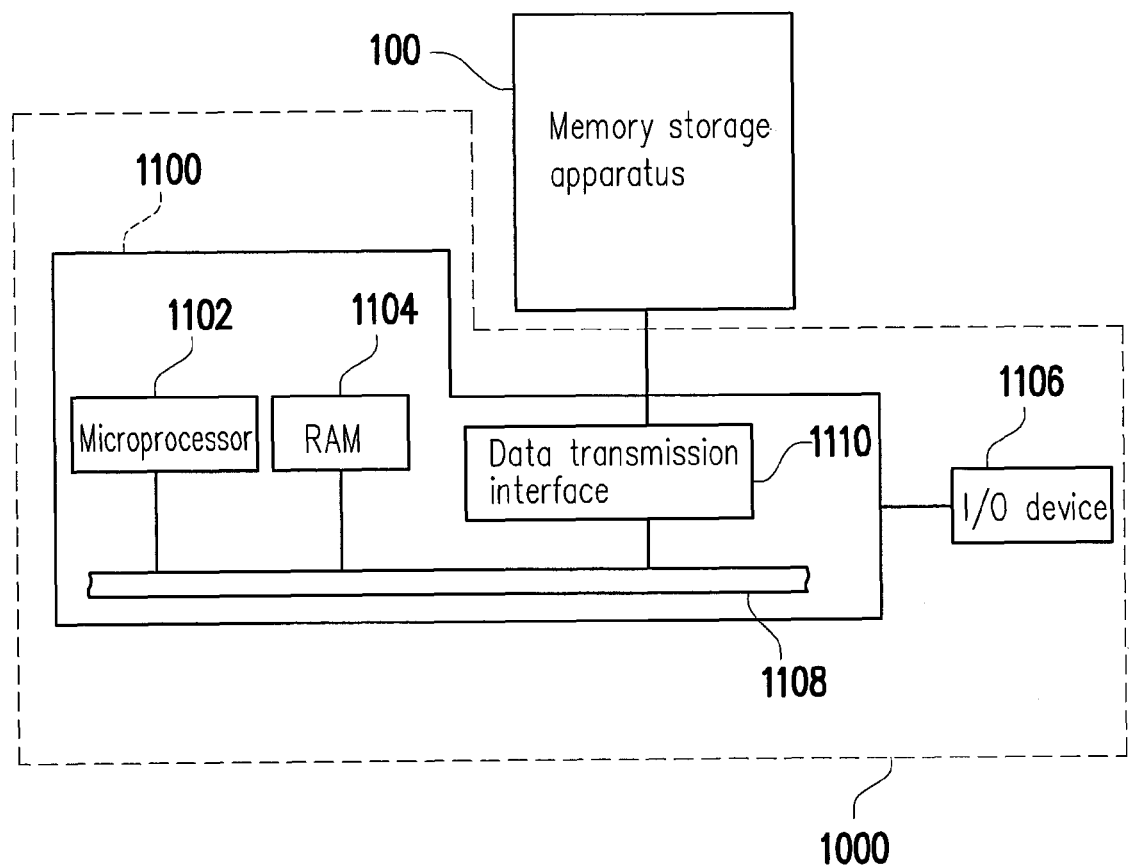
FIG. 3 illustrates a host system and a memory storage apparatus according to the first exemplary embodiment of the present invention.

FIG. 3 illustrates a host system and a memory storage apparatus according to the first exemplary embodiment of the present invention.

Figure 4:
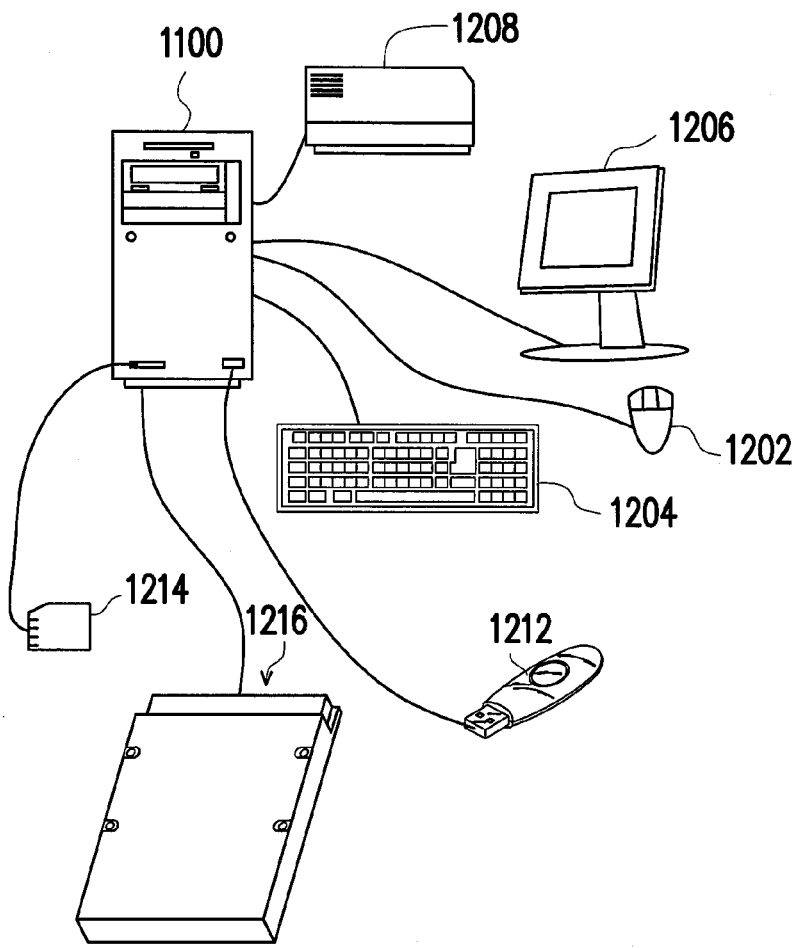
FIG. 4 is a schematic diagram illustrating a computer, an input/output (I/O) device, and a memory storage apparatus according to an exemplary embodiment of the present invention.

Referring to FIG. 3, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 4. It should be understood that the I/O device 1106 is not limited to the devices illustrated in FIG. 4 and may further include other devices.

In the exemplary embodiment of the present invention, the memory storage apparatus 100 is coupled to other devices of the host system 1000 through the data transmission interface 1110. By operating the microprocessor 1102, the RAM 1104, and the I/O device 1106, the data can be written into or read from the memory storage apparatus 100. For instance, the memory storage apparatus 100 may be a rewritable non-volatile memory storage apparatus, such as a flash drive 1212, a memory card 1214, or a solid state drive (SSD) 1216 as shown in FIG. 4.

Figure 5:
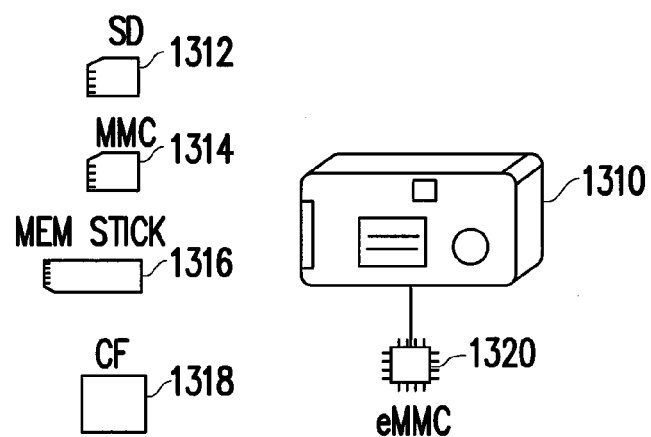
FIG. 5 a schematic diagram illustrating a host system and a memory storage apparatus according to an exemplary embodiment of the present invention.

Generally, the host system 1000 can substantially be any system operated together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so forth. For instance, if the host system is a digital camera (video camera) 1310, the rewritable non-volatile memory storage apparatus is an SD card 1312, an MMC 1314, a memory stick 1316, a CF card 1318, or an embedded storage apparatus 1320 (as shown in FIG. 5). The embedded storage device 1320 includes an embedded MMC (eMMC). It should be mentioned that the eMMC is directly coupled to the substrate of the host system.

Figure 6:
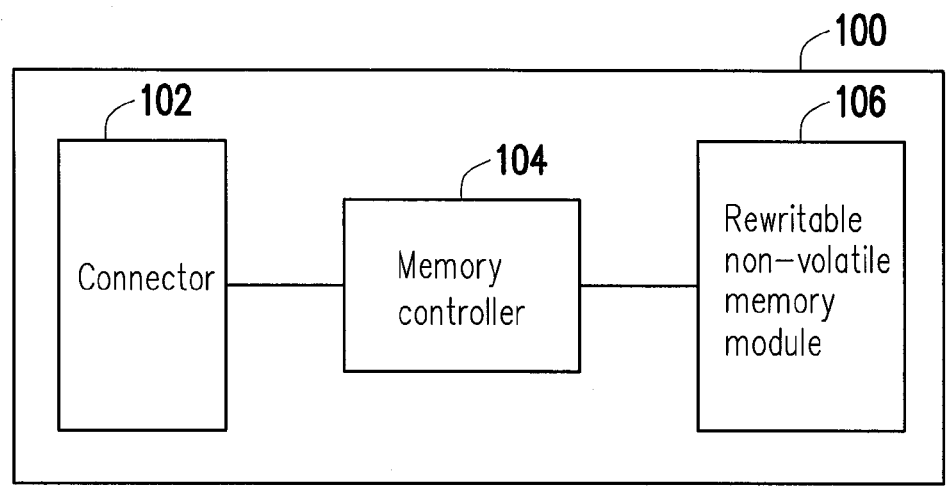
FIG. 6 is a schematic block diagram illustrating a memory storage apparatus according to an exemplary embodiment of the present invention.

FIG. 6 is a schematic block diagram illustrating the memory storage apparatus according to the first exemplary embodiment of the present invention.

Referring to FIG. 6, the memory storage apparatus 100 includes a connector 102, a memory controller 104, and a rewritable non-volatile memory module 106.

In the present exemplary embodiment, the connector 102 complies with the universal serial bus (USB) standard. However, it should be understood that the present invention is not limited thereto. The connector 102 may also comply with the parallel advanced technology attachment (PATA) standard, the Institute of Electrical and Electronic Engineers (IEEE) 1394 standard, the peripheral component interconnect (PCI) express standard, the secure digital (SD) interface standard, the serial advanced technology attachment (SATA) standard, the ultra high speed-I (UHS-I) interface standard, the ultra high speed-II (UHS-II) interface standard, the memory stick (MS) interface standard, the multi media card (MMC) standard, the embedded multimedia card (eMMC) interface standard, the universal flash storage (UFS) interface standard, the compact flash (CF) standard, the integrated device electronics (IDE) standard, or other suitable standards.

The memory controller 104 is configured to execute a plurality of logic gates or control instructions implemented in a form of hardware or firmware and performing various data operations in the rewritable non-volatile memory module 106 according to commands issued by the host system 1000, such as data writing, reading, erasing, merging, and so on.

The rewritable non-volatile memory module 106 includes a first rewritable non-volatile memory sub-module 106a and a second rewritable non-volatile memory sub-module 106b. The first rewritable non-volatile memory sub-module 106a is formed by packaging a first rewritable non-volatile memory chip 106-1 and a first heater 108-1, and the second rewritable non-volatile memory sub-module 106b is formed by packaging a second rewritable non-volatile memory chip 106-2 and a second heater 108-2.

The first rewritable non-volatile memory chip 106-1 and the second rewritable non-volatile memory chip 106-2 are coupled to the memory controller 104 and configured to store the data written by the host system 1000. For example, the first rewritable non-volatile memory chip 106-1 and the second rewritable non-volatile memory chip 106-2 may be a single level cell (SLC) NAND flash memory module (i.e. a flash memory module capable of storing data of 1 bit in a memory cell), a multi-level cell (MLC) NAND flash memory module (i.e. a flash memory module capable of storing data of 2 bits in a memory cell), a trinary level cell (TLC) NAND flash memory module (i.e. a flash memory module capable of storing data of 3 bits in a memory cell), other flash memory module or other memory module having the same characteristic, respectively.

Figure 7A:
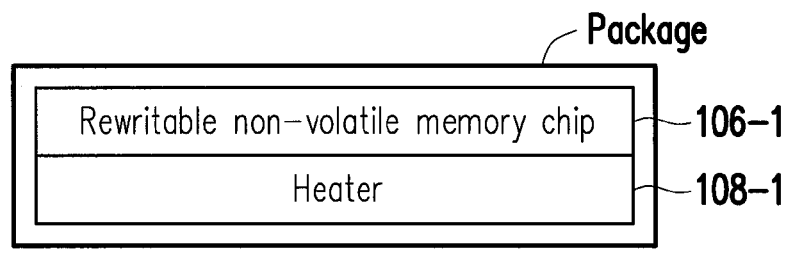
FIGS. 7A~7B are schematic diagrams of packaging a rewritable non-volatile memory chip and a heater according to the first exemplary embodiment of the present invention.
Figure 7B:
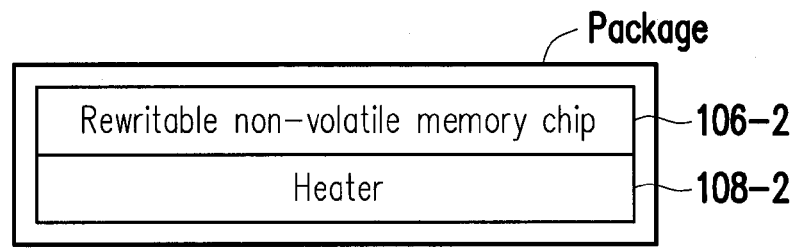
Figure 7C:
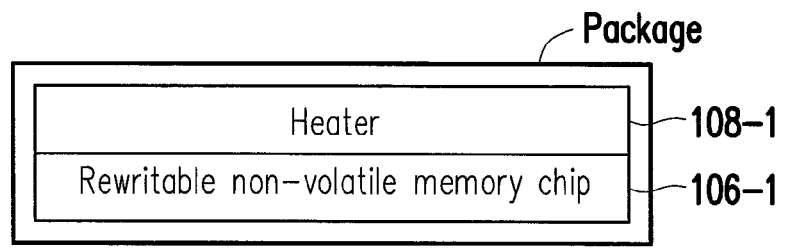
FIGS. 7C~7D are schematic diagrams of packaging a rewritable non-volatile memory chip and a heater according to another exemplary embodiment of the present invention.
Figure 7D:
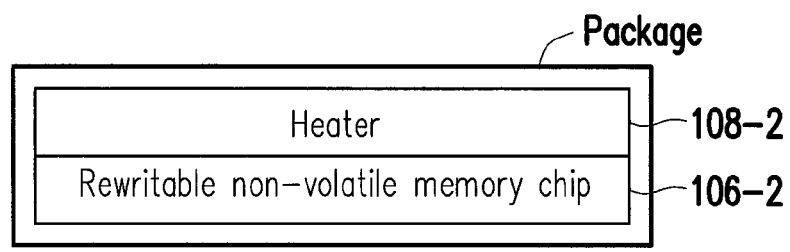

The first heater 108-1 and the second heater 108-2 is coupled to the memory controller 104 and configured to heat the first rewritable non-volatile memory chip 106-1 and the second rewritable non-volatile memory chip 106-2, respectively. To be specific, the first heater 108-1 is packaged under the first rewritable non-volatile memory chip 106-1 (as shown in FIG. 7A) and the second heaters 108-2 is packaged under the second rewritable non-volatile memory chip 106-2 (as shown in FIG. 7B). And, the first heater 108-1 may heat the first rewritable non-volatile memory chip 106-1 and rise the temperature of the first rewritable non-volatile memory chip 106-1 to be between 100° C.~600° C. and the second heater 108-2 may heat the second rewritable non-volatile memory chip 106-2 and rise the temperature of the second rewritable non-volatile memory chip 106-2 to be between 100° C.~600° C. For example, the first heater 108-1 may heat the first rewritable non-volatile memory chip 106-1 and rise the temperature of the first rewritable non-volatile memory chip 106-1 to be 300° C. and the second heater 108-2 may heat the second rewritable non-volatile memory chip 106-2 and rise the temperature of the second rewritable non-volatile memory chip 106-2 to be 300° C. It should be noted that, in the present exemplary embodiment, the heaters are packaged under the rewritable non-volatile memory chips, but the present invention is not limited thereto. For example, in another exemplary embodiment, a heater may be packaged above a rewritable non-volatile memory chip. Additionally, in an exemplary embodiment, one heater is disposed above a rewritable non-volatile memory chip and another heater is disposed under the rewritable non-volatile memory chip. Furthermore, in another exemplary embodiment, each side of a rewritable non-volatile memory chip may be disposed with a heater.

Additionally, it should be noted that in the present exemplary embodiment, the heaters are disposed for heating the rewritable non-volatile memory module in units of each rewritable non-volatile memory chip, but the present invention is not limited thereto. For example, in another exemplary embodiment, a rewritable non-volatile memory chip is composed of a plurality of memory dies or a plurality of memory planes and a plurality of heaters are disposed respectively for heating the rewritable non-volatile memory module in units of each memory die or memory plane.

Figure 8:
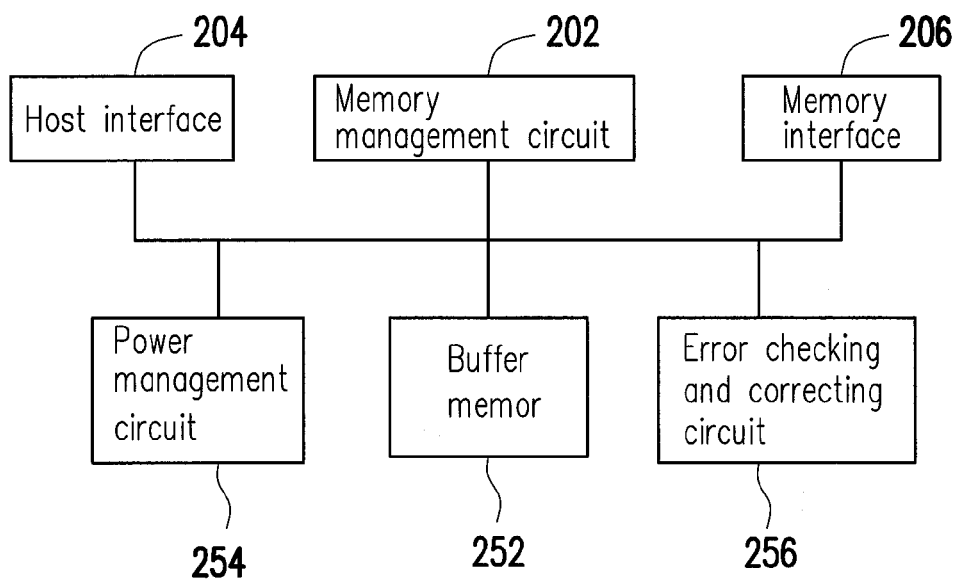
FIG. 8 is a schematic block diagram illustrating a memory controller according to the first exemplary embodiment of the present invention.

FIG. 8 is a schematic block diagram illustrating a memory controller according to the first exemplary embodiment of the present invention. It should be understood that the structure of the memory controller illustrated in FIG. 8 is merely an example, and the invention is not limited thereto.

Referring to FIG. 8, the memory controller 104 includes a memory management circuit 202, a host interface 204 and a memory interface 206.

The memory management circuit 202 is configured to control the overall operation of the memory controller. To be specific, the memory management circuit 202 has a plurality of control instructions, and when the memory storage apparatus 100 is in operation, the control instructions are executed to perform operations such as data writing, data reading, data erasing and so forth.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage apparatus 100 is in operation, the control instructions are executed by the microprocessor unit to perform operations such as data writing, data reading, data erasing and so forth.

In another exemplary embodiment of the present invention, the control instructions of the memory management circuit 202 may also be stored as program codes in a specific area of the rewritable non-volatile memory module 106 (for example, a system area exclusively used for storing system data in a memory module). Besides, the memory management circuit 202 has a microprocessor unit (not shown), a ROM (not shown), and a RAM (not shown). In particular, the ROM has boot codes, and when the memory controller 104 is enabled, the microprocessor unit first executes the boot codes to load the control instructions from the rewritable non-volatile memory module 106 into the RAM of the memory management circuit 202. Thereafter, the microprocessor unit executes the control instructions to perform operations such as data writing, data reading, data erasing and so forth.

Further, in another exemplary embodiment of the invention, the control instructions of the memory management circuit 202 may also be implemented in a hardware form. For instance, the memory management circuit 202 includes a micro controller, a memory cell management circuit, a memory writing circuit, a memory reading circuit, a memory erasing circuit and a data processing circuit. These circuits are coupled to the micro controller. Here, the memory cell management circuit is configured to manage physical erasing units of the rewritable non-volatile memory module 106. The memory writing circuit is configured to issue a write instruction to the rewritable non-volatile memory module 106 for writing data thereto. The memory reading circuit is configured to issue a read instruction to the rewritable non-volatile memory module 106 for reading data therefrom. The memory erasing circuit is configured to issue an erase instruction to the rewritable non-volatile memory module 106 for erasing data therefrom. And, the data processing circuit is configured to process data that is about to be written to the rewritable non-volatile memory module 106 or data read from the rewritable non-volatile memory module 106.

The host interface 204 is coupled to the memory management circuit 202 and configured to receive and identify instructions and data transmitted from the host system 1000. Namely, the instructions and data transmitted from the host system 1000 are transmitted to the memory management circuit 202 through the host interface 204. In the present exemplary embodiment, the host interface 204 complies with the USB standard. However, it is should be noted that the present invention is not limited thereto, and the host interface 204 can also comply with the PATA standard, the IEEE 1394 standard, the PCI Express standard, the SD standard, the SATA standard, the UHS-I interface standard, the UHS-II interface standard, the MS standard, the MMC standard, the eMMC interface standard, the UFS interface standard, the CF standard, the IDE standard, or any other appropriate data transmission standard.

The memory interface 206 is coupled to the memory management circuit 202 and configured to access the rewritable non-volatile memory module 106. In other words, data that is about to be written to the rewritable non-volatile memory module 106 is transformed to an acceptable format for the rewritable non-volatile memory module 106 by the memory interface 206.

In an exemplary embodiment of the present invention, the memory controller 104 further includes a buffer memory 252, a power management circuit 254 and an error checking and correcting circuit 256.

The buffer memory 252 is coupled to the memory management circuit 202 and configured to temporarily store the data and instructions from the host system 1000 or the data from the rewritable non-volatile memory module 106.

The power management circuit 254 is coupled to the memory management circuit 202 and configured to control the power of the memory storage apparatus 100.

The error checking and correcting circuit 256 is coupled to the memory management circuit 202 and configured to perform an error checking and correcting procedure to ensure the accuracy of data. In the present exemplary embodiment, when the memory management circuit 202 receives a write instruction from the host system 1000, the error checking and correcting circuit 256 generates an error checking and correcting code (ECC code) corresponding to data corresponding to the write instruction, and the memory management circuit 202 then writes the data corresponding to the write instruction and the corresponding ECC code to the rewritable non-volatile memory module 106. Afterwards, when reading data from the rewritable non-volatile memory module 106, the memory management circuit 202 also reads the corresponding ECC code, and the error checking and correcting circuit 256 executes an error checking and correcting procedure on the read data according to the ECC code. In particular, the error checking and correcting circuit 256 is configured as capable of correcting a number of error bits (which is referred to as a maximum number of correctable error bits hereinafter). For example, the maximum number of correctable error bits is 24. If a number of the error bits occurring in the read data is not more than 24, the error checking and correcting circuit 256 corrects the error bits back to accurate values according to the ECC code. Otherwise, the error checking and correcting circuit 256 reports a failure of error correcting, and the memory management circuit 202 transmits a message indicating that the data is lost to the host system 1000.

In the present exemplary embodiment, the memory controller 104 (or the memory management circuit 202) monitors the wear degree of the rewritable non-volatile memory module 106, and repairs the rewritable non-volatile memory module 106. Specifically, in the present exemplary embodiment, the memory controller 104 (or the memory management circuit 202) records an erase count of a rewritable non-volatile memory chip for identifying the wear degree of the rewritable non-volatile memory module 106. Additionally, the memory controller 104 (or the memory management circuit 202) determines whether the erase count of the rewritable non-volatile memory chip is larger than a threshold (hereinafter referred to as "erase count threshold"). If the erase count of the rewritable non-volatile memory chip is larger than the erase count threshold, the memory controller 104 (or the memory management circuit 202) repairs memory cells of the rewritable non-volatile memory chip by heating the rewritable non-volatile memory chip through a corresponding heater. In the present exemplary embodiment, every when performing an erase command on a rewritable non-volatile memory chip, the erase count of the rewritable non-volatile memory chip may be added by 1. Additionally, the above-mentioned erase count threshold may set based on the kind of the rewritable non-volatile memory chip, thereby identifying whether the wear degree of the rewritable non-volatile memory chip is reach a critical point, which may influence the storing of data.

For example, if the erase count of the first rewritable non-volatile memory chip 106-1 is larger than the erase count threshold, the memory controller 104 (or the memory management circuit 202) copies data stored in the first rewritable non-volatile memory chip 106-1 into the second rewritable non-volatile memory chip 106-2, controls the first heater 108-1 to heat the first rewritable non-volatile memory chip 106-1 and then restores the copied data back to the first rewritable non-volatile memory chip 106-1.

It should be noted that in the present exemplary embodiment, the erase count of the rewritable non-volatile memory chip is used for identifying the wear degree of the rewritable non-volatile memory chip, but the present invention is not limited thereto. For example, the wear degree of a rewritable non-volatile memory chip may be evaluated according to a write count, an error bit amount, an error bit ratio or a read count of the rewritable non-volatile memory chip or a parameter combination partially or entirely composed of the erase count, the write count, the error bit amount, the error bit ratio and the read count of the rewritable non-volatile memory chip.

Figure 9:
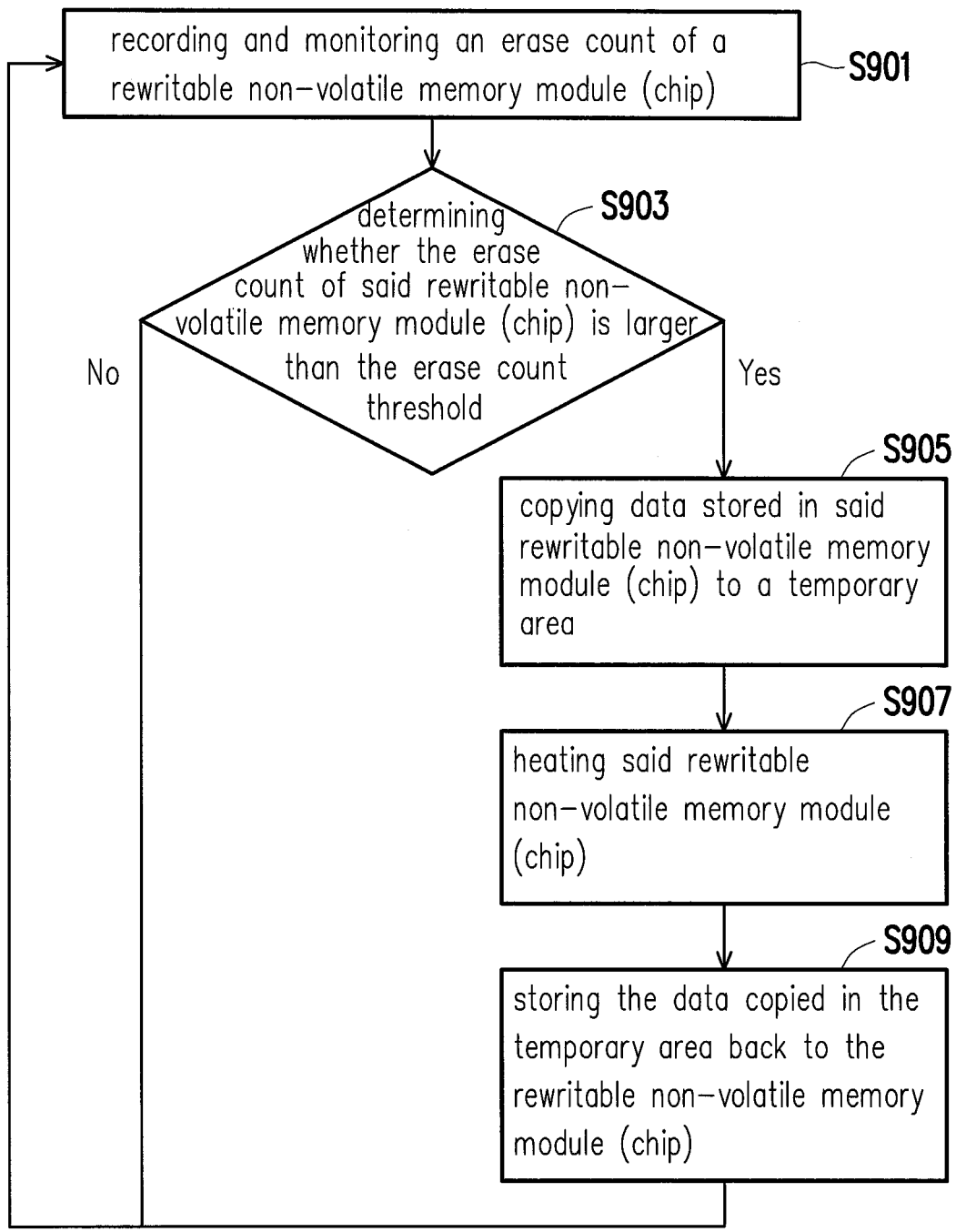
FIG. 9 is a flowchart illustrating a memory repairing method according to the first exemplary embodiment of the present invention.

FIG. 9 is a flowchart illustrating a memory repairing method according to the first exemplary embodiment of the present invention.

Referring to FIG. 9, in step S901, an erase count of a rewritable non-volatile memory module (chip) is recorded and monitored.

In step S903, whether the erase count of said rewritable non-volatile memory module (chip) is larger than the erase count threshold is determined.

If the erase count of said rewritable non-volatile memory module (chip) is not larger than the erase count threshold, the process goes back to step S901. If the erase count of said rewritable non-volatile memory module (chip) is larger than the erase count threshold, in step S905, data stored in said rewritable non-volatile memory module (chip) is copied to a temporary area. For example, in step S905, the data stored in said rewritable non-volatile memory module (chip) is copied to another rewritable non-volatile memory module (chip). However, the present invention is not limited thereto. For example, the data stored in said rewritable non-volatile memory module (chip) may be copied to the buffer memory 252 or another storage apparatus.

Then, in step S907, said rewritable non-volatile memory module (chip) is heated, such that the temperature of said rewritable non-volatile memory module (chip) is increased to be between 100° C.~600° C. For example, the memory controller 104 (or the memory management circuit 202) controls a heater (e.g., the first heater 180-1) packaged with said rewritable non-volatile memory chip to heat said rewritable non-volatile memory chip, such that the temperature of said rewritable non-volatile memory chip rises to 300° C. and keeps a predetermined time (e.g., 20 minutes).

After that, in step S909, the data copied in the temporary area is stored back to the rewritable non-volatile memory module (chip) and the process goes back to step S901.

Second Exemplary Embodiment

The second exemplary embodiment illustrates a structure of a memory storage apparatus similar to the memory storage apparatus of the first exemplary embodiment, and the difference there between is that each physical erase unit of a rewritable non-volatile memory module equipped with a heating circuit and a memory controller may heat each physical erase unit through the heating circuit. The difference between the second exemplary embodiment and the first exemplary embodiment will be described by using the same symbols used in the first exemplary embodiment.

Figure 10:
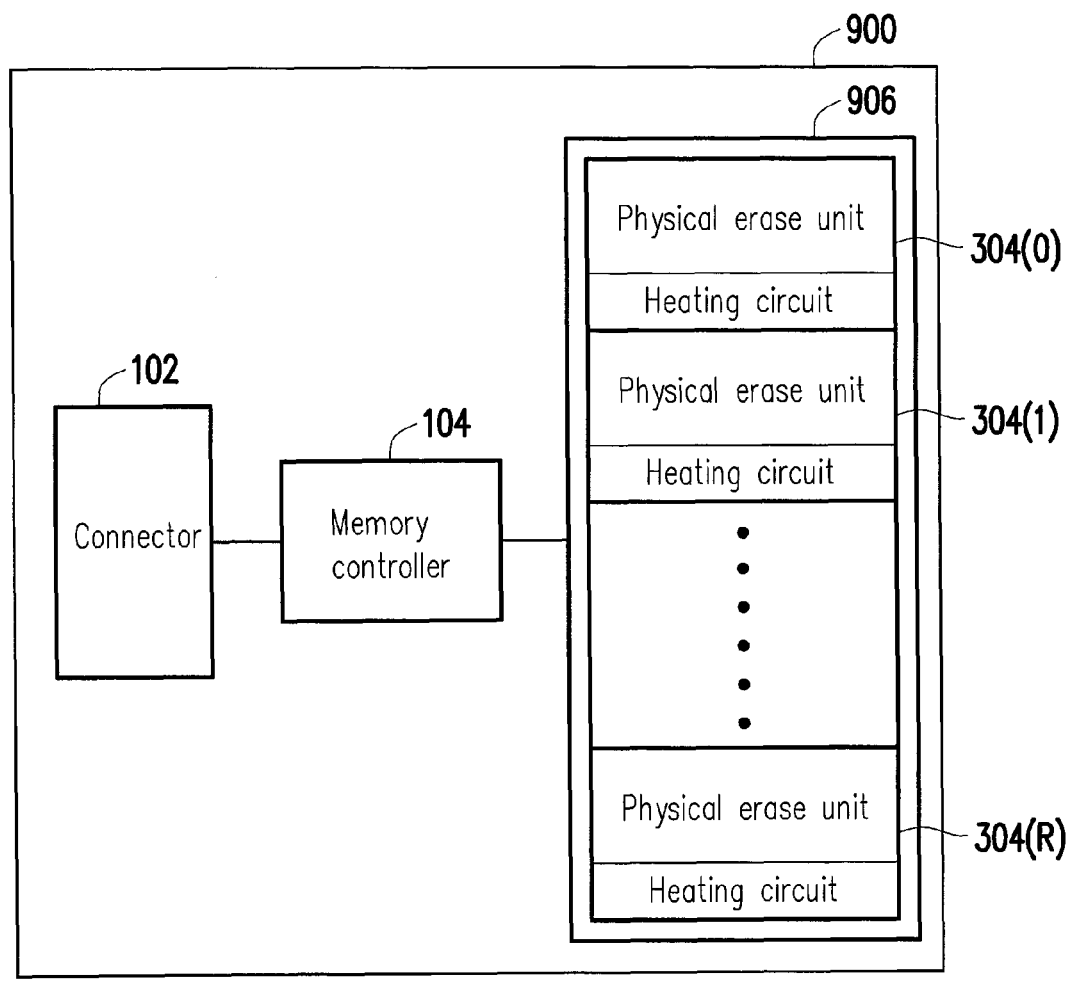
FIG. 10 is a schematic block diagram illustrating the memory storage apparatus according to a second exemplary embodiment of the present invention.

FIG. 10 is a schematic block diagram illustrating the memory storage apparatus according to the second exemplary embodiment of the present invention.

A memory storage apparatus 900 includes the connector 102, the memory controller 104, and a rewritable non-volatile memory module 906.

The rewritable non-volatile memory module 906 is coupled to the memory controller 104 and configured to store data written by the host system 1000. The rewritable non-volatile memory module 906 has physical erase units 304(0)-304(R). The physical erase units 304(0)-304(R) may belong to the same memory die or different memory dies. Each physical erase unit has a plurality of physical program units. The physical program units belonging to the same physical erase unit can be individually written but have to be erased all together. Each physical erase unit may be composed of 128 physical program units. However, the present invention is not limited thereto, and each physical erase unit may also be composed of 64, 256, or any other number of physical program units.

To be specific, a physical erase unit is the smallest unit for erasing data. Namely, each physical erase unit contains the least number of memory cells that are erased all together. A physical program unit is the smallest unit for programming data. Namely, a physical program unit is the smallest unit for writing data. Each physical program unit usually includes a data bit area and a redundant bit area. The data bit area includes a plurality of physical access addresses for storing user data, and the redundant bit area is used for storing system data (for example, control information and error checking and correcting codes (ECCs)). In the present exemplary embodiment, the data bit area of each physical program unit includes 4 physical access addresses, and the size of each physical access address is 512 bytes. However, the size and number of the physical access addresses are not limited in the invention, and in other exemplary embodiments, a data bit area may also any greater or smaller number of physical access addresses. In an exemplary embodiment, the physical erase units are physical blocks, and the physical program units are physical pages or physical sectors. However, the present invention is not limited thereto.

In the present exemplary embodiment, the rewritable non-volatile memory module 906 is a trinary level cell (TLC) NAND flash memory module (i.e., each memory cell stores data of at least 3 bits). However, the present invention is not limited thereto, and the rewritable non-volatile memory module 906 may also be a single level cell (SLC) NAND flash memory module, MLC NAND flash memory module, any other flash memory module, or any memory module with the same characteristics.

Figure 11:
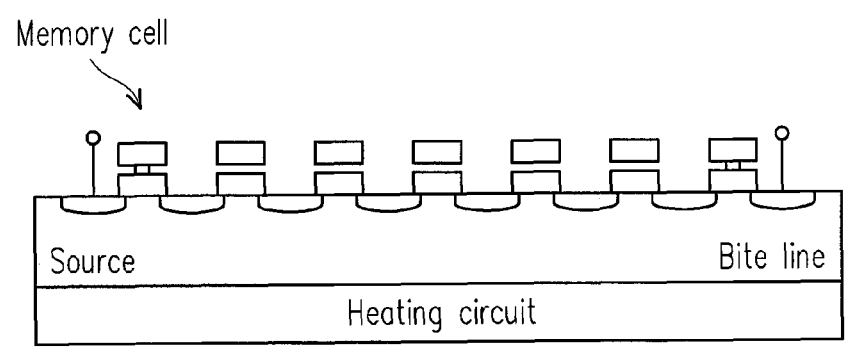
FIG. 11 is a schematic structural diagram illustrating a physical erase unit according to the second exemplary embodiment of the present invention.

In particular, each of the physical erase units 304(0)-304(R) has a heating circuit. For example, a heating circuit is disposed under a plurality of memory cells constituted a physical erase unit, as shown in FIG. 11.

In the present exemplary embodiment, the memory controller 104 (or the memory management circuit 202) records and monitors an erase count of each physical erase unit and if an erase count of one of the physical erase units is larger than the erase count threshold, the memory controller 104 (or the memory management circuit 202) may heat said physical erase unit through the corresponding heating circuit, thereby increasing the temperature of said physical erase unit to be between 100° C.~600° C. and repairing deteriorated memory cells in said physical erase unit.

For example, if the erase count of the physical erase unit 304(0) is larger than the erase count threshold, the memory controller 104 (or the memory management circuit 202) copies data stored in the physical erase unit 304(0) into an empty physical erase unit (e.g., physical erase unit 304(R)), controls the heating circuit disposed in the physical erase unit 304(0) to heat the physical erase unit 304(0) and then restores the copied data back to the physical erase unit 304(0) from the physical erase unit 304(R).

Figure 12:
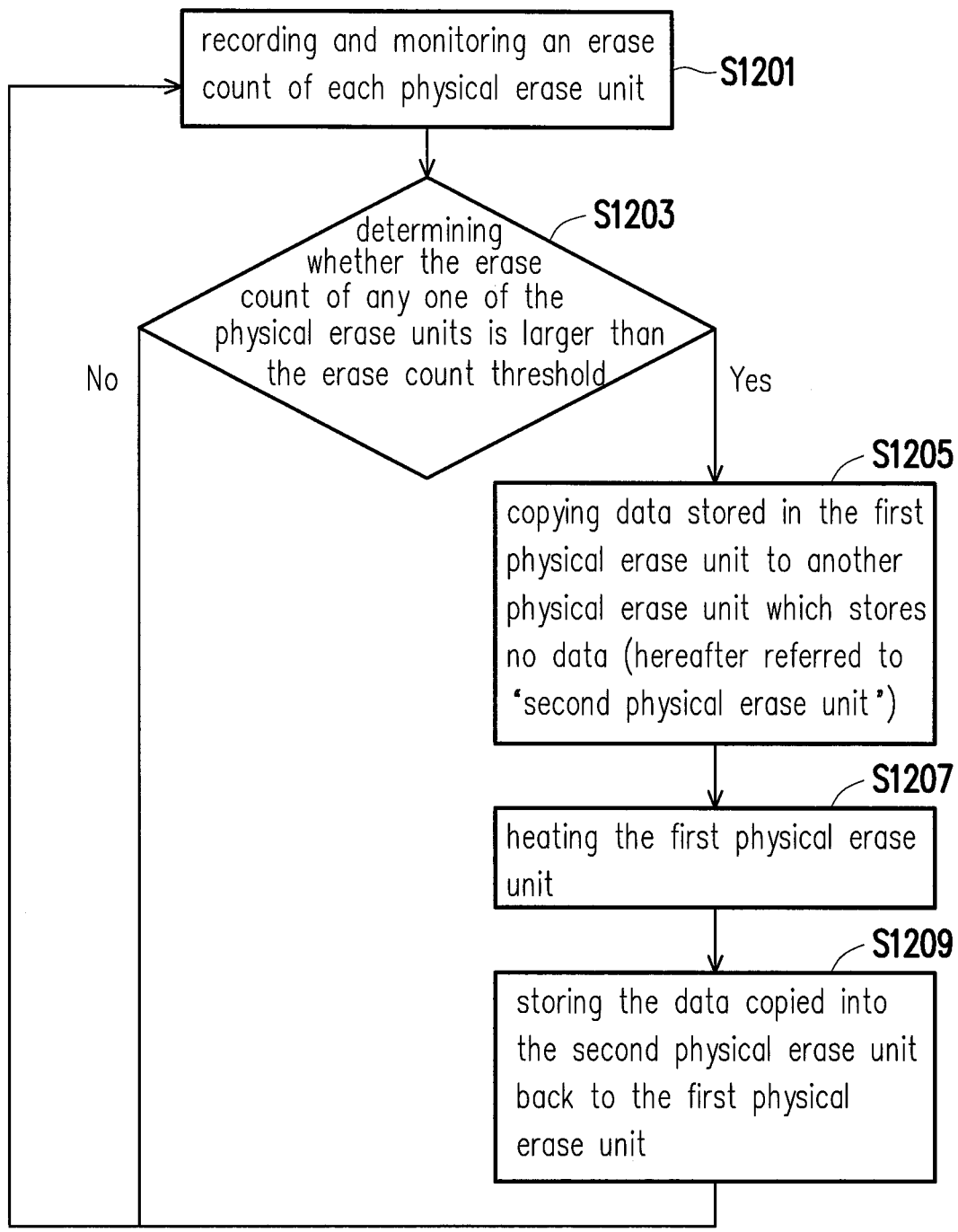
FIG. 12 is a flowchart illustrating a memory repairing method according to the second exemplary embodiment of the present invention.

FIG. 12 is a flowchart illustrating a memory repairing method according to the second exemplary embodiment of the present invention.

Referring to FIG. 12, in step S1201, an erase count of each physical erase unit is recorded and monitored.

In step S1203, whether the erase count of any one of the physical erase units is larger than the erase count threshold is determined.

If the erase count of each physical erase units is not larger than the erase count threshold, the process goes back to step S1201. If the erase count of one of the physical erase units (hereafter referred to "first physical erase unit") is larger than the erase count threshold, in step S1205, data stored in the first physical erase unit is copied to another physical erase unit which stores no data (hereafter referred to "second physical erase unit"). However, the present invention is not limited thereto. For example, the data stored in the first physical erase unit may be copied to the buffer memory 252.

Then, in step S1207, the first physical erase unit is heated, such that the temperature of the first physical erase unit rises to be between 100° C.~600° C. For example, the memory controller 104 (or the memory management circuit 202) enables the heating circuit of the first physical erase unit, such that the temperature of the first physical erase unit rises to 450° C. and keeps a predetermined time (e.g., 10 minutes).

After that, in step S1209, the data copied into the second physical erase unit is stored back to the first physical erase unit and the process goes back to step S1201.

Figure 13:
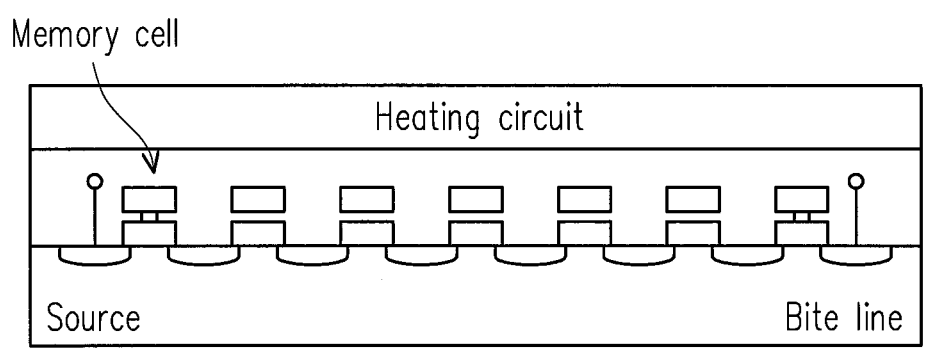
FIG. 13 is a schematic structural diagram illustrating a physical erase unit according to another exemplary embodiment of the present invention.

It should be noted, in the present exemplary embodiment, the heating circuit is disposed under each physical erase unit, but the present invention is not limited thereto. In another exemplary embodiment, the heating circuit may be disposed above the control gate of each physical erase unit, as shown in FIG. 13. Furthermore, in another exemplary embodiment, one heating circuit may be disposed above a physical erase unit, and another heating circuit may be disposed under the physical erase unit.

It should be noted that in the present exemplary embodiment, the erase count of a physical erase unit is used for identifying the wear degree of the physical erase unit, but the present invention is not limited thereto. For example, the wear degree of a physical erase unit may be evaluated according to a write count, an error bit amount, an error bit ratio or a read count of the physical erase unit or a parameter combination partially or entirely composed of the erase count, the write count, the error bit amount, the error bit ratio and the read count of the physical erase unit.

Based on the above, in the memory repairing method, the memory controller and the memory storage apparatus according to the exemplary embodiments of the present invention, when the wear degree of the rewritable non-volatile memory module is larger than the threshold, the rewritable non-volatile memory module is heated. Accordingly, deteriorated memory cells can be repaired and the lifetime of the rewritable non-volatile memory module can be prolonged. The previously described exemplary embodiments of the present invention have the advantages aforementioned, wherein the advantages aforementioned not required in all versions of the invention.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A memory repairing method for a rewritable non-volatile memory module, the memory repairing method comprising:
   monitoring a wear degree of at least a portion of a rewritable non-volatile memory module; and
   heating the at least a portion of the rewritable non-volatile memory module when the wear degree of the at least a portion of the rewritable non-volatile memory module is larger than a threshold.

2. The memory repairing method according to claim 1, wherein the step of heating the at least a portion of the rewritable non-volatile memory module comprises rising a temperature of the at least a portion of the rewritable non-volatile memory module to be between 100° C.~600° C.

3. The memory repairing method according to claim 1, wherein the rewritable non-volatile memory module comprises a first rewritable non-volatile memory sub-module and a second rewritable non-volatile memory sub-module, the first rewritable non-volatile memory sub-module is formed by packaged a first rewritable non-volatile memory chip and a first heater, and the second rewritable non-volatile memory sub-module is formed by packaged a second rewritable non-volatile memory chip and a second heater,
   wherein the step of monitoring the wear degree of the at least a portion of the rewritable non-volatile memory module comprises recording a wear degree value of the first rewritable non-volatile memory chip,
   wherein the step of heating the at least a portion of the rewritable non-volatile memory module when the wear degree of the at least a portion of the rewritable non-volatile memory module is larger than the threshold comprises:
   determining whether the wear degree value of the first rewritable non-volatile memory chip is larger than the threshold;
   copying data stored in the first rewritable non-volatile memory chip to the second rewritable non-volatile memory chip and heating the first rewritable non-volatile memory chip through the first heater if the wear degree value of the first rewritable non-volatile memory chip is larger than the threshold, wherein a temperature of the first rewritable non-volatile memory chip rises to be between 100° C.~600° C. and keeps a predetermined time; and
   storing the data copied to the second rewritable non-volatile memory chip back to the first rewritable non-volatile memory chip.

4. The memory repairing method according to claim 1, wherein the rewritable non-volatile memory module comprises a first rewritable non-volatile memory sub-module, and the first rewritable non-volatile memory sub-module is formed by packaged a first rewritable non-volatile memory chip and a first heater,
   wherein the step of monitoring the wear degree of the at least a portion of the rewritable non-volatile memory module comprises recording a wear degree value of the first rewritable non-volatile memory chip,
   wherein the step of heating the at least a portion of the rewritable non-volatile memory module when the wear degree of the at least a portion of the rewritable non-volatile memory module is larger than the threshold comprises:
   determining whether the wear degree value of the first rewritable non-volatile memory chip is larger than the threshold;
   copying data stored in the first rewritable non-volatile memory chip to a buffer memory and heating the first rewritable non-volatile memory chip through the first heater if the wear degree value of the first rewritable non-volatile memory chip is larger than the threshold, wherein a temperature of the first rewritable non-volatile memory chip rises to be between 100° C.~600° C. and keeps a predetermined time; and
   storing the data copied to the buffer memory back to the first rewritable non-volatile memory chip.

5. The memory repairing method according to claim 1, wherein the rewritable non-volatile memory module comprises a plurality of physical erase unit and each of the physical erase units is equipped with a heating circuit,
   wherein the step of monitoring the wear degree of the at least a portion of the rewritable non-volatile memory module comprises recording a wear degree value of each of the physical erase unit,
   wherein the step of heating the at least a portion of the rewritable non-volatile memory module when the wear degree of the at least a portion of the rewritable non-volatile memory module is larger than the threshold comprises:
determining whether a wear degree value of a first physical erase unit among the physical erase unit is larger than the threshold;
copying data stored in the first physical erase unit to a second physical erase unit among the physical erase units and heating the first physical erase unit through a heating circuit corresponding to the first physical erase unit if the wear degree value of the first physical erase unit among the physical erase unit is larger than the threshold, wherein a temperature of the first physical erase unit rises to be between 100° C.~600° C. and keeps a predetermined time; and
storing the data copied to the second physical erase unit back to the first physical erase unit.

6. The memory repairing method according to claim 3, wherein the wear degree value of the first rewritable non-volatile memory chip is evaluated according to at least one of an erase count, a write count, an error bit amount, an error bit ratio and a read count of the first rewritable non-volatile memory chip.

7. The memory repairing method according to claim 5, wherein the wear degree value of the first physical erase unit is evaluated according to at least one of an erase count, a write count, an error bit amount, an error bit ratio and a read count of the first physical erase unit.

8. The memory repairing method according to claim 1, wherein the at least a portion of the rewritable non-volatile memory module is a memory die or a memory plane.

9. A memory controller for controlling a rewritable non-volatile memory module, the memory controller comprising:
a host interface configured to couple to a host system;
a memory interface configured to couple to the rewritable non-volatile memory module;
a buffer memory; and
a memory management circuit coupled to the host interface, the memory interface and the buffer memory and configured to monitor a wear degree of at least a portion of the rewritable non-volatile memory module,
wherein the memory management circuit instructs to heat the at least a portion of the rewritable non-volatile memory module when the wear degree of at least a portion of the rewritable non-volatile memory module is larger than a threshold.

10. The memory controller according to claim 9, wherein a temperature of the at least a portion of the rewritable non-volatile memory module is heated to rise to be between 100° C.~600° C.

11. The memory controller according to claim 9, wherein the rewritable non-volatile memory module comprises a first rewritable non-volatile memory sub-module and a second rewritable non-volatile memory sub-module, the first rewritable non-volatile memory sub-module is formed by packaged a first rewritable non-volatile memory chip and a first heater, and the second rewritable non-volatile memory sub-module is formed by packaged a second rewritable non-volatile memory chip and a second heater,
wherein in the operation of monitoring the wear degree of the at least a portion of the rewritable non-volatile memory module, the memory management circuit records a wear degree value of the first rewritable non-volatile memory chip,
wherein in the operation of heating the at least a portion of the rewritable non-volatile memory module when the wear degree of the at least a portion of the rewritable non-volatile memory module is larger than the threshold, the memory management circuit determines whether the wear degree value of the first rewritable non-volatile memory chip is larger than the threshold,
wherein if the wear degree value of the first rewritable non-volatile memory chip is larger than the threshold, the memory management circuit copies data stored in the first rewritable non-volatile memory chip to the second rewritable non-volatile memory chip, instructs the first heater to heat the first rewritable non-volatile memory chip, and stores the data copied to the second rewritable non-volatile memory chip back to the first rewritable non-volatile memory chip,
wherein a temperature of the first rewritable non-volatile memory chip is heated to rise to be between 100° C.~600° C. and keep a predetermined time.

12. The memory controller according to claim 9, wherein the rewritable non-volatile memory module comprises a first rewritable non-volatile memory sub-module, and the first rewritable non-volatile memory sub-module is formed by packaged a first rewritable non-volatile memory chip and a first heater,
wherein in the operation of monitoring the wear degree of the at least a portion of the rewritable non-volatile memory module, the memory management circuit records a wear degree value of the first rewritable non-volatile memory chip,
wherein in the operation of heating the at least a portion of the rewritable non-volatile memory module when the wear degree of the at least a portion of the rewritable non-volatile memory module is larger than the threshold, the memory management circuit determines whether the wear degree value of the first rewritable non-volatile memory chip is larger than the threshold,
wherein if the wear degree value of the first rewritable non-volatile memory chip is larger than the threshold, the memory management circuit copies data stored in the first rewritable non-volatile memory chip to the buffer memory, instructs the first heater to heat the first rewritable non-volatile memory chip and stores the data copied to the buffer memory back to the first rewritable non-volatile memory chip,
wherein a temperature of the first rewritable non-volatile memory chip is heated to rise to be between 100° C.~600° C. and keep a predetermined time.

13. The memory controller according to claim 9, wherein the rewritable non-volatile memory module comprises a plurality of physical erase unit and each of the physical erase units is equipped with a heating circuit,
wherein in the operation of monitoring the wear degree of the at least a portion of the rewritable non-volatile memory module, the memory management circuit records a wear degree value of each of the physical erase unit,
wherein in the operation of heating the at least a portion of the rewritable non-volatile memory module when the wear degree of the at least a portion of the rewritable non-volatile memory module is larger than the threshold, the memory management circuit determines whether the wear degree value of a first physical erase unit among the physical erase units is larger than the threshold,
wherein if the wear degree value of the first physical erase unit among the physical erase units is larger than the threshold, the memory management circuit copies data stored in the first physical erase unit to a second physical erase unit among the physical erase units, instructs a heating circuit corresponding to the first physical erase unit to heat the first physical erase unit, and stores the data copied to the second physical erase unit back to the first physical erase unit, wherein a temperature of the first physical erase unit is heated to rise to be between 100° C.~600° C. and keep a predetermined time.

14. The memory controller according to claim 11, wherein the wear degree value of the first rewritable non-volatile memory chip is evaluated according to at least one of an erase count, a write count, an error bit amount, an error bit ratio and a read count of the first rewritable non-volatile memory chip.

15. The memory controller according to claim 13, wherein the wear degree value of the first physical erase unit is evaluated according to at least one of an erase count, a write count, an error bit amount, an error bit ratio and a read count of the first physical erase unit.

16. The memory controller according to claim 9, wherein the at least a portion of the rewritable non-volatile memory module is a memory die or a memory plane.

17. A memory storage apparatus,
a connector configured to couple to a host system;
a rewritable non-volatile memory module; and
a memory controller having a buffer memory and coupled to the connector and the rewritable non-volatile memory module,
wherein the memory controller is configured to monitor a wear degree of at least a portion of the rewritable non-volatile memory module,
wherein the memory controller instructs to heat the at least a portion of the rewritable non-volatile memory module when the wear degree of the at least a portion of the rewritable non-volatile memory module is larger than a threshold.

18. The memory storage apparatus according to claim 17, wherein a temperature of the at least a portion of the rewritable non-volatile memory module is heated to rise to be between 100° C.~600° C.

19. The memory storage apparatus according to claim 17, wherein the rewritable non-volatile memory module comprises a first rewritable non-volatile memory sub-module and a second rewritable non-volatile memory sub-module, the first rewritable non-volatile memory sub-module is formed by packaged a first rewritable non-volatile memory chip and a first heater, and the second rewritable non-volatile memory sub-module is formed by packaged a second rewritable non-volatile memory chip and a second heater,
wherein in the operation of monitoring the wear degree of the at least a portion of the rewritable non-volatile memory module, the memory controller records a wear degree value of the first rewritable non-volatile memory chip,
wherein in the operation of heating the at least a portion of the rewritable non-volatile memory module when the wear degree of the at least a portion of the rewritable non-volatile memory module is larger than the threshold, the memory controller determines whether the wear degree value of the first rewritable non-volatile memory chip is larger than the threshold,
wherein if the wear degree value of the first rewritable non-volatile memory chip is larger than the threshold, the memory controller copies data stored in the first rewritable non-volatile memory chip to the second rewritable non-volatile memory chip, instructs the first heater to heat the rewritable non-volatile memory chip, and stores the data copied to the second rewritable non-volatile memory chip back to the first rewritable non-volatile memory chip,
wherein a temperature of the first rewritable non-volatile memory chip is heated to rise to be between 100° C.~600° C. and keep a predetermined time.

20. The memory storage apparatus according to claim 17, wherein the rewritable non-volatile memory module comprises a first rewritable non-volatile memory sub-module, and the first rewritable non-volatile memory sub-module is formed by packaged a first rewritable non-volatile memory chip and a first heater,
wherein in the operation of monitoring the wear degree of the at least a portion of the rewritable non-volatile memory module, the memory controller records a wear degree value of the first rewritable non-volatile memory chip,
wherein in the operation of heating the at least a portion of the rewritable non-volatile memory module when the wear degree of the at least a portion of the rewritable non-volatile memory module is larger than the threshold, the memory controller determines whether the wear degree value of the first rewritable non-volatile memory chip is larger than the threshold,
wherein if the wear degree value of the first rewritable non-volatile memory chip is larger than the threshold, the memory controller copies data stored in the first rewritable non-volatile memory chip to the buffer memory, instructs the first heater to heat the first rewritable non-volatile memory chip and stores the data copied to the buffer memory back to the first rewritable non-volatile memory chip,
wherein a temperature of the first rewritable non-volatile memory chip is heated to rise to be between 100° C.~600° C. and keep a predetermined time.

21. The memory storage apparatus according to claim 17, wherein the rewritable non-volatile memory module comprises a plurality of physical erase unit and each of the physical erase units is equipped with a heating circuit,
wherein in the operation of monitoring the wear degree of the at least a portion of the rewritable non-volatile memory module, the memory controller records a wear degree value of each of the physical erase units,
wherein in the operation of heating the at least a portion of the rewritable non-volatile memory module when the wear degree of the at least a portion of the rewritable non-volatile memory module is larger than the threshold, the memory controller determines whether a wear degree value of a first physical erase unit among the physical erase unit is larger than the threshold,
wherein if the wear degree value of the first physical erase unit among the physical erase unit is larger than the threshold, the memory controller copies data stored in the first physical erase unit to a second physical erase unit among the physical erase units, instructs a heating circuit corresponding to the first physical erase unit to heat the first physical erase unit, and stores the data copied to the second physical erase unit back to the first physical erase unit,
wherein a temperature of the first physical erase unit is heated to rise to be between 100° C.~600° C. and keep a predetermined time.

22. The memory storage apparatus according to claim 19, wherein the wear degree value of the first rewritable non-volatile memory chip is evaluated according to at least one of an erase count, a write count, an error bit amount, an error bit ratio and a read count of the first rewritable non-volatile memory chip.

23. The memory storage apparatus according to claim 21, wherein the wear degree value of the first physical erase unit is evaluated according to at least one of an erase count, a write count, an error bit amount, an error bit ratio and a read count of the first physical erase unit.

24. The memory storage apparatus according to claim 17, wherein the at least a portion of the rewritable non-volatile memory module is a memory die or a memory plane.

\* \* \* \* \*